US011863067B2

(12) United States Patent
Cai et al.

(10) Patent No.: US 11,863,067 B2
(45) Date of Patent: Jan. 2, 2024

(54) BRIDGE CASCADE SYSTEM

(71) Applicant: Sungrow Power Supply Co., Ltd., Hefei (CN)

(72) Inventors: Guoqing Cai, Anhui (CN); Jiacai Zhuang, Anhui (CN); Xinyu Wang, Anhui (CN); Jun Xu, Anhui (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 30 days.

(21) Appl. No.: 17/528,273

(22) Filed: Nov. 17, 2021

(65) Prior Publication Data
US 2022/0209659 A1 Jun. 30, 2022

(30) Foreign Application Priority Data
Dec. 29, 2020 (CN) .......................... 202011587863.5

(51) Int. Cl.
*H02M 5/275* (2006.01)
*H02M 5/293* (2006.01)
(Continued)

(52) U.S. Cl.
CPC ............. *H02M 3/155* (2013.01); *H02M 1/08* (2013.01); *H02M 5/275* (2013.01); *H02M 5/293* (2013.01)

(58) Field of Classification Search
CPC ....... H02M 3/155; H02M 5/275; H02M 5/293
See application file for complete search history.

(56) References Cited

U.S. PATENT DOCUMENTS 6,256,215 B1 * 7/2001 Barrett ................ H03K 17/063
307/77
8,558,584 B2 * 10/2013 Draxelmayr .......... H02M 7/538
327/108
(Continued)

FOREIGN PATENT DOCUMENTS

CN 103151906 A 6/2013
CN 104767381 A 7/2015
(Continued)

OTHER PUBLICATIONS

Third Office Action for Chinese Application No. 202011587863.5, dated Oct. 10, 2022.
(Continued)

*Primary Examiner* — Gary A Nash
(74) *Attorney, Agent, or Firm* — Wolf, Greenfield & Sacks, P.C.

(57) ABSTRACT

Provided is a bridge cascade system, which includes at least one phase unit and a driving unit for the phase unit. The phase unit includes N bridge topologies cascaded on alternating current AC sides. The driving unit includes one driving power supply circuit, multiple bootstrap power supply circuits and 2N driving circuits. In the phase unit, the driving circuits are powered by the driving power supply circuit directly or through corresponding bootstrap power supply circuits. The driving circuits are configured to provide driving signals for corresponding switch transistors in the phase unit. In this way, one driving power supply is matched with multiple bootstrap power supply circuits, realizing power supply to the driving circuits corresponding to the switch transistors of all bridge topologies, which reduces the difficulty in designing the driving power supply for the bridge cascade system and reduces cost for the system.

19 Claims, 15 Drawing Sheets

(51) Int. Cl.
*H02M 3/155* (2006.01)
*H02M 1/08* (2006.01)

(56) References Cited

U.S. PATENT DOCUMENTS

| | | | |
|---|---|---|---|
| 8,558,586 B1 * | 10/2013 | Martin | H03K 17/6871 |
| | | | 327/108 |
| 10,263,516 B1 * | 4/2019 | Notsch | H02M 3/156 |
| 10,291,128 B1 | 5/2019 | Kwon et al. | |
| 2009/0195068 A1 | 8/2009 | Ohashi et al. | |
| 2014/0361759 A1 | 12/2014 | Lei et al. | |
| 2015/0311797 A1 | 10/2015 | Okamatsu et al. | |
| 2019/0028094 A1 * | 1/2019 | Reusch | H03K 17/063 |
| 2019/0052177 A1 * | 2/2019 | Lu | H02M 7/797 |
| 2021/0242768 A1 | 8/2021 | Ishikura | |

FOREIGN PATENT DOCUMENTS

| | | | |
|---|---|---|---|
| CN | 104838572 A | 8/2015 | |
| CN | 206226280 U | 6/2017 | |
| EP | 1887698 B1 * | 4/2012 | ......... H03K 17/0814 |
| JP | 2009-177951 A | 8/2009 | |
| JP | 2014-033614 A | 2/2014 | |
| JP | WO 2020/085008 A1 | 9/2021 | |
| WO | WO 2020/085008 A1 | 4/2020 | |

OTHER PUBLICATIONS

Extended European Search Report for European Application No. 21207902.4, dated Apr. 12, 2022.
Second Office Action for Chinese Application No. 202011587863.5, dated May 6, 2022.
Shuvo et al., Design and hardware implementation considerations of modified multilevel cascaded H-bridge inverter for photovoltaic system. IEEE Access. Jan. 24, 2019;7:16504-24.
CN202011587863.5, Oct. 10, 2022, Third Office Action.
EP21207902.4, Apr. 12, 2022, Extended European Search Report.
CN202011587863.5, May 6, 2022, Second Office Action.

* cited by examiner

BRIDGE CASCADE SYSTEM

CROSS REFERENCE OF RELATED APPLICATION

The present application claims the priority to Chinese Patent Application No. 202011587863.5, titled "BRIDGE CASCADE SYSTEM", filed on Dec. 29, 2020 with the State Intellectual Property Office of People's Republic of China, which is incorporated herein by reference in its entirety.

FIELD

The present disclosure relates to the field of electronic power technology, and in particular to a bridge cascade system.

BACKGROUND

For a complementary half-bridge topology, a driving circuit of a switch transistor on a high-voltage side cannot share a driving power supply with a driving circuit of a switch transistor on a low-voltage side. The switch transistor on the high-voltage side or the low-voltage side may be a power MOSFET or IGBT, for example. A bootstrap power supply is a widely used means for powering a high-voltage driving circuit. The bootstrap power supply technology has advantages of simplicity and low cost. A basic working principle of a bootstrap power supply circuit is explained below with reference to an exemplary structure shown in FIG. 1.

When a low-voltage side switch transistor LS is in on-state (for example, when the low-voltage side switch transistor LS is controlled to turn on or a backward diode in the low-voltage side switch transistor LS works), and a high-voltage side switch transistor HS is in off-state, the neutral point potential Vs of a bridge arm is pulled low. A driving power supply Vcc charges a bootstrap capacitor Cboot through a bootstrap diode Dboot and a bootstrap resistor Rboot, as shown by the dashed path in FIG. 1. When the high-voltage side switch transistor HS is in on-state, the neutral point potential Vs is pulled up to a high potential, the bootstrap diode Dboot is reverse-biased, and the driving power supply Vcc is isolated from the high-voltage driving circuit Dr2. In this case, the high-voltage driving circuit Dr2 is powered by the bootstrap capacitor Cboot, and Dr1 is a low-voltage driving circuit.

However, in a system adopting the complementary half-bridge topology, each complementary half-bridge topology includes its own bootstrap power supply and driving power supply, which causes complexity of the complementary half-bridge topology and a high cost for hardware thereof.

SUMMARY

In view of the above, a purpose of the present disclosure is to provide a bridge cascade system, which can reduce the difficulty in designing a driving power supply for the bridge cascade system and reduces cost for the system.

A bridge cascade system is provided in the present disclosure, which includes at least one phase unit and a driving unit for the phase unit. The phase unit includes N bridge topologies cascaded on alternating current AC sides, where N is an integer greater than 1. The driving unit includes one driving power supply circuit, multiple bootstrap power supply circuits and 2N driving circuits. In the phase unit, the driving power supply circuit powers the driving circuits directly or through corresponding bootstrap power supply circuits. The driving circuits are configured to provide driving signals for corresponding switch transistors in the phase unit.

In an embodiment, the bootstrap power supply circuits in the phase unit are connected in parallel.

In an embodiment, the bootstrap power supply circuits in the phase unit are connected in series.

In an embodiment, the bootstrap power supply circuits in the phase unit are sequentially connected in series according to potentials of corresponding switch transistors from high to low. When connected in series, an input terminal of the bootstrap power supply circuit in the series corresponding to the switch transistor with a lowest potential is connected to an output terminal of the driving power supply circuit.

In an embodiment, the bootstrap power supply circuits in the phase unit are connected in a hybrid of serial connection and parallel connection.

In an embodiment, N=2 and there are three bootstrap power supply circuits in the phase unit. The three bootstrap power supply circuits are respectively referred to as, according to potentials from high to low: a first bootstrap power supply circuit, a second bootstrap power supply circuit, and a third bootstrap power supply circuit. In the phase unit, a series arrangement of the second bootstrap power supply circuit and the third bootstrap power supply circuit is connected in parallel with the first bootstrap power supply circuit, or a series arrangement of the first bootstrap power supply circuit and the third bootstrap power supply circuit is connected in parallel with the second bootstrap power supply circuit; or a series arrangement of the first bootstrap power supply circuit and the second bootstrap power supply circuit is connected in parallel with the third bootstrap power supply circuit; or a parallel arrangement of the second bootstrap power supply circuit and the third bootstrap power supply circuit is connected in series with the first bootstrap power supply circuit; or a parallel arrangement of the first bootstrap power supply circuit and the third bootstrap power supply circuit is connected in series with the second bootstrap power supply circuit.

In an embodiment, each of the bootstrap power supply circuits includes a bootstrap diode and a bootstrap capacitor. A cathode of the bootstrap diode is connected to a terminal of the bootstrap capacitor, and a connecting point is used as an output terminal of a corresponding bootstrap power supply circuit. An anode of the bootstrap diode is used as an input terminal of the corresponding bootstrap power supply circuit. Another terminal of the bootstrap capacitor is connected to a source of a corresponding switch transistor.

In an embodiment, in the phase unit, at least one of the bootstrap power supply circuits is reused by arbitrary two of the driving circuits.

In an embodiment, in the phase unit, the bootstrap power supply circuit is reused by a low-voltage side driving circuit in a bridge topology that has higher potential and a high-voltage side driving circuit in another bridge topology that has lower potential.

In an embodiment, in the phase unit, the driving circuit of the bridge topology that has lowest potential is directly connected to the driving power supply circuit.

In an embodiment, N is greater than or equal to 3.

In an embodiment, each of the bridge topologies is one of a complementary half-bridge topology, a complementary full-bridge topology, and a Buck-boost topology.

In an embodiment, in the phase unit, the bridge topologies are cascaded on AC sides by a common source electrode, or cascaded on AC sides by a common drain electrode.

In an embodiment, the bridge cascade system further includes a controller, configured to control, via the one of two driving circuits, each of the bridge topologies in the phase unit to work in a corresponding working mode.

In an embodiment, when the controller controls to make each of the bridge topologies in the phase unit to work in a corresponding working mode, the controller controls each of the bridge topologies in the phase unit to work in either a chopping mode or a pseudo continuous conduction mode (PCCM), wherein a low-voltage side switch transistor in a bridge topology working in the pseudo continuous conduction mode is intermittently turned on.

In an embodiment, when the controller controls each of the bridge topologies in the phase unit to work in either the chopping mode or the pseudo continuous conduction mode, the controller controls each of the bridge topologies in the phase unit to all work in the chopping mode or all work in the pseudo continuous conduction mode, so as to make the bootstrap power supply circuits in the phase unit be charged in one cycle.

In an embodiment, when there are at least two bootstrap circuits connected in parallel in the phase unit, the waveforms of the corresponding bridge topologies do not completely overlap with each other, so as to make the bootstrap power supply circuits in the phase unit be charged in one cycle.

In an embodiment, when the controller controls each of the bridge topologies in the phase unit to work in either the chopping mode or the pseudo continuous conduction mode, the controller controls, in the phase unit, at least one of the bridge topologies to work in the chopping mode, and at least one of the bridge topologies to work in the pseudo continuous conduction mode, so as to make the bootstrap power supply circuits in the phase unit be charged in one cycle.

In an embodiment, in the phase unit, when the bridge topologies are cascaded on AC sides by a common drain electrode, the high-voltage switch transistors of two adjacent bridge topologies are not turned on simultaneously.

Based on the above technical solutions, a bridge cascade system is provided in the present disclosure. The bridge cascade system includes at least one phase unit and a driving unit for the phase unit. The phase unit includes N bridge topologies cascaded on alternating current AC sides. The driving unit includes one driving power supply circuit, multiple bootstrap power supply circuits and 2N driving circuits. In the phase unit, the driving power supply circuit powers the driving circuits directly or through corresponding bootstrap power supply circuits. The driving circuits are configured to provide driving signals for corresponding switch transistors in the phase unit. In this way, one driving power supply is matched with multiple bootstrap power supply circuits, realizing power supply to the driving circuits corresponding to the switch transistors of all bridge topologies, which reduces the difficulty in designing the driving power supply for the bridge cascade system and reduces cost for the system.

BRIEF DESCRIPTION OF THE DRAWINGS

In order to illustrate technical solutions in embodiments of the present disclosure or in the conventional technology more clearly, drawings to be used in the description of the embodiments or the conventional technology are briefly described below. Apparently, the drawings in the following description show only embodiments of the present disclosure, and those skilled in the art may obtain other drawings from the drawings without any creative effort.

DETAILED DESCRIPTION OF EMBODIMENTS

In order to make objects, technical solutions and advantages of the embodiments of the present disclosure clearer, the technical solutions in the embodiments of the present disclosure are described clearly and completely in conjunction with the drawings in the embodiments of the disclosure hereinafter. It is apparent that the described embodiments are only some rather than all embodiments of the present disclosure. Any other embodiments obtained by those skilled in the art based on the embodiments in the present disclosure without any creative effort shall fall within the protection scope of the present disclosure.

In this specification, terms "include", "comprise" or any other variants are intended to be non-exclusive. Therefore, a process, method, article or device including a series of elements includes not only those elements but also other elements that are not enumerated, or further includes elements inherent for the process, method, article or device.

Unless expressively limited otherwise, the statement "comprising (including) a . . . " does not exclude existence of another identical element in a process, method, article or device including the enumerated elements.

According to an embodiment of the present disclosure, a bridge cascade system is provided to solve a problem that: in a system applying a bridge topology, each bridge topology includes its own bootstrap power supply and driving power supply, which causes complexity of the bridge topology and a high cost for hardware thereof.

Figure 1:
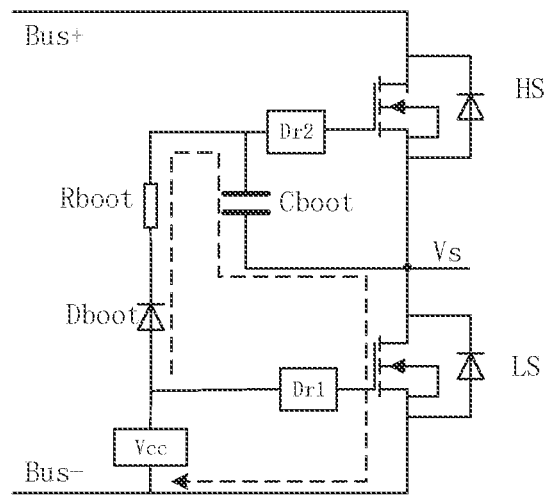
FIG. 1 is a schematic diagram of a bridge topology according to a conventional technology.
Figure 2:
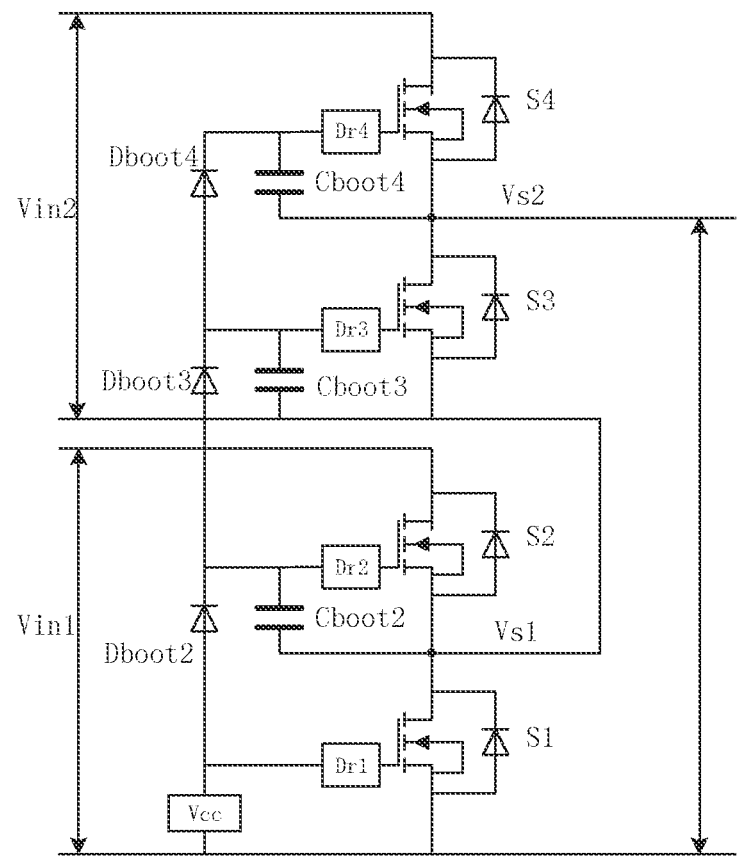
FIG. 2 is a schematic diagram of a bridge cascade system according to an embodiment of the present disclosure.

Referring to FIG. 2, the bridge cascade system includes at least one phase unit and a driving unit for the phase unit.

The phase unit includes N bridge topologies cascaded on alternating current AC sides, where N is an integer greater than 1.

It should be noted that the bridge topology is one of a complementary half-bridge topology, a complementary full-bridge topology and a Buck-boost topology. Apparently, other topologies are not excluded and fall within the protection scope of the present disclosure, which are not described in detail herein.

Description is made below referring to an example in which the bridge topology is a complementary half-bridge topology. Each bridge topology includes two switch transistors connected in series. A drain of a first switch transistor is connected to a positive electrode at an input end of the bridge topology. A source of the first switch transistor is connected to a drain of a second switch transistor. A source of the second switch transistor is connected to a negative electrode at the input end of the bridge topology. In this configuration, the first switch transistor is a high-voltage side switch transistor, and the second switch transistor is a low-voltage side switch transistor. Correspondingly, a driving circuit corresponding to the high-voltage side switch transistor is a high-voltage side driving circuit, and a driving circuit corresponding to the low-voltage side switch transistor is a low-voltage side driving circuit.

FIGS. 2-20 each show an example in which the bridge topology is a complementary half-bridge topology. When the bridge topology is of another type, such as a complementary full-bridge topology or a Buck-boost topology, specific structure and corresponding control principle of the bridge topology are similar to those shown in FIGS. 2-20, and fall within the protection scope of the present disclosure, which are not described in detail herein.

It should be noted that if the bridge cascade system includes two or more phase units, the phase units may be completely the same or not, which depends on an actual situation and is no limited herein, and shall all fall within the protection scope of the present disclosure.

The driving unit includes one driving power supply circuit, multiple bootstrap power supply circuits and 2N driving circuits.

In the phase unit, the driving power supply circuit supplies power to the driving circuits directly or through corresponding bootstrap power supply circuits, that is, the driving power supply circuit can implement a cross-bridge topology to supply power to a corresponding driving circuit. The driving circuits are configured to provide driving signals for corresponding switch transistors in the phase unit.

Specifically, as shown in FIG. 2, N is equal to 2, and there is 1 phase unit in the bridge cascade system, which is only an example used for the following description.

The driving power supply circuit Vcc directly supplies power to a driving circuit Dr1. The driving circuit Dr1 is configured to provide a driving signal for a switch transistor S1. The driving power supply circuit Vcc supplies power to a driving circuit Dr2 through a bootstrap power supply circuit including elements Dboot2 and Cboot2 as shown in FIG. 2. The driving circuit Dr2 is configured to provide a driving signal for a switch transistor S2. The driving power supply circuit Vcc supplies power to a driving circuit Dr3 through a bootstrap power supply circuit including elements Dboot3 and Cboot3 as shown in FIG. 2. The driving circuit Dr3 is configured to provide a driving signal for a switch transistor S3. The driving power supply circuit Vcc supplies power to a driving circuit Dr4 through a bootstrap power supply circuit including elements Dboot4 and Cboot4 as shown in FIG. 2. The driving circuit Dr4 is configured to provide a driving signal for a switch transistor S4.

Apparently, N may assume another value, or other numbers of phase units may be included in the bridge cascade system for which the specific structure is similar to that shown in FIG. 2; these variations shall all fall within the protection scope of the present disclosure, and are not described in detail herein. In practical applications, each of the bootstrap power supply circuits may further include a resistor connected in series with a corresponding diode. The number and resistance of the resistor may depend on its specific application and are not specifically limited herein, and shall all fall within the protection scope of the present disclosure.

In this embodiment, one driving power supply in the bridge cascade system is matched with multiple bootstrap power supply circuits, so as to supply power to driving circuits corresponding to the switch transistors of all bridge topology, which reduces the difficulty in designing the driving power supply for the bridge cascade system and reduces cost for the system.

In practical applications, bootstrap power supply circuits in a phase unit may be connected in various manners, such as connected in series and/or in parallel. Described below are situations where the bootstrap power supply circuits in the phase unit are connected in parallel, connected in series and connected in a combination thereof, respectively.

(1) The bootstrap power supply circuits in the phase unit are connected in parallel Input terminals of the bootstrap power supply circuits are each connected to an output terminal of the driving power supply circuit.

Figure 3:
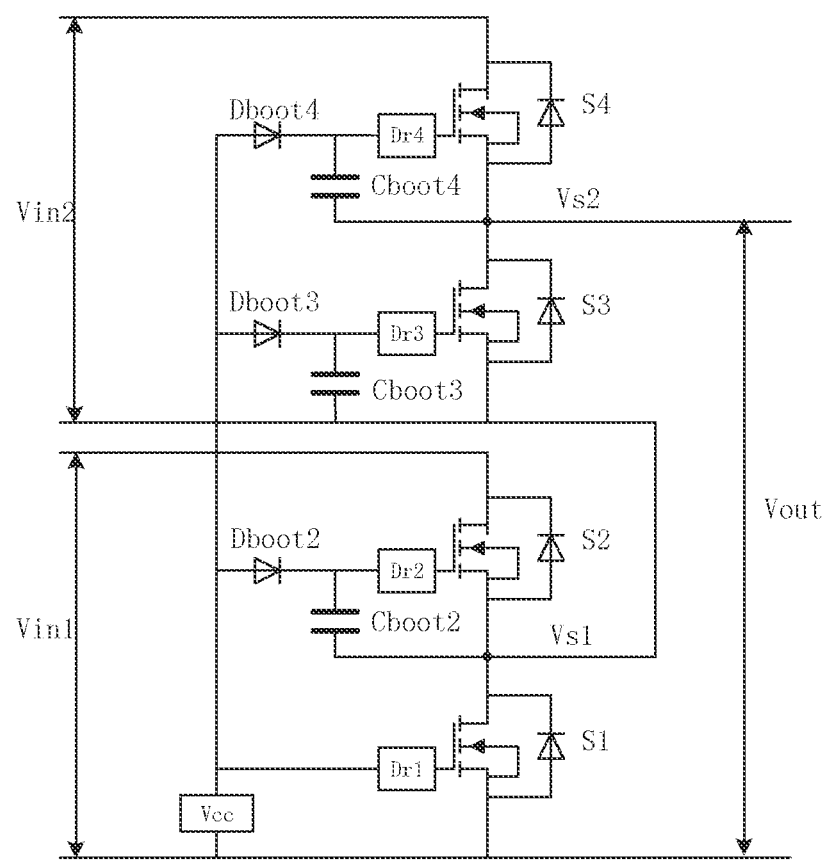
FIG. 3 is a schematic diagram of a bridge cascade system according to another embodiment of the present disclosure.

Specifically, reference is made to FIG. 3, which shows an example where there are 2 bridge topologies (N=2) and 3 bootstrap power supply circuits. In the description, the bootstrap power supply circuit including Cboot2 and Dboot2 as shown in FIG. 3 is referred to as a first bootstrap power supply circuit; the bootstrap power supply circuit including Cboot3 and Dboot3 as shown in FIG. 3 is referred to as a second bootstrap power supply circuit; and the bootstrap power supply circuit including Cboot4 and Dboot4 as shown in FIG. 3 is referred to as a third bootstrap power supply circuit.

An input terminal of the first bootstrap power supply circuit, an input terminal of the second bootstrap power supply circuit and an input terminal of the third bootstrap power supply circuit are each connected to the output terminal of the driving power supply circuit Vcc. An output terminal of the first bootstrap power supply circuit is connected to an input terminal of the driving circuit Dr2, an output terminal of the second bootstrap power supply circuit is connected to an input terminal of the driving circuit Dr3, and an output terminal of the third bootstrap power supply circuit is connected to an input terminal of the driving circuit Dr4. The output terminal of the driving power supply circuit Vcc is further directly connected to an input terminal of the driving circuit Dr1.

In other words, the input terminal of each bootstrap power supply circuit is directly connected to the output terminal of the driving power supply circuit Vcc.

(2) The bootstrap power supply circuits in the phase unit are connected in series sequentially It should be noted that the bootstrap power supply circuits are connected in series in a corresponding sequence. For example, in the phase unit, there are 3 bootstrap power supply circuits, referred to as a first bootstrap power supply circuit, a second bootstrap power supply circuit, and a third bootstrap power supply circuit. Specifically, the connection sequence may be any of the following, a sequence of the driving power supply circuit, the first bootstrap power supply circuit, the second bootstrap power supply circuit, and the third bootstrap power supply circuit; and a sequence of the driving power supply circuit, the second bootstrap power supply circuit, the first bootstrap power supply circuit, and the third bootstrap power supply circuit. Apparently, other connection sequences are possible, but the mentioned two connection sequences are preferred in consideration of the withstand voltage of the bootstrap power supply circuit.

A specific connection mode of the bootstrap power supply circuits sequentially connected in series depends on an actual situation and is not specifically limited herein, and all shall fall within the protection scope of the present disclosure.

In practical applications, the bootstrap power supply circuits in the phase unit are sequentially connected in series according to potentials of corresponding switch transistors from high to low. When connected in series, an input terminal of the bootstrap power supply circuit corresponding to the switch transistor with the lowest potential is connected to the output terminal of the driving power supply circuit.

Referring to FIG. 2, for ease of description, the bootstrap power supply circuit including Cboot2 and Dboot2 as shown in FIG. 2 is referred to as the first bootstrap power supply circuit, the bootstrap power supply circuit including Cboot3 and Dboot3 as shown in FIG. 2 is referred to as the second bootstrap power supply circuit, and the bootstrap power supply circuit including Cboot4 and Dboot4 as shown in FIG. 2 is referred to as the third bootstrap power supply circuit.

An input terminal of the first bootstrap power supply circuit and an input terminal of the driving circuit Dr1 are both connected to the output terminal of the driving power supply circuit Vcc. An output terminal of the first bootstrap power supply circuit is connected respectively to an input terminal of the driving circuit Dr2 and an input terminal of the second bootstrap power supply circuit. An output terminal of the second bootstrap power supply circuit is connected respectively to an input terminal of the driving circuit Dr3 and an input terminal of the third bootstrap power supply circuit. An output terminal of the third bootstrap power supply circuit is connected to an input terminal of the driving circuit Dr4.

(3) The bootstrap power supply circuits in the phase unit are connected by a hybrid of serial connection and parallel connection There are various connection configurations for connecting the bootstrap power supply circuits in a hybrid manner of both parallel connection and cascading connection, which are not described in detail herein, and are all within the protection scope of the present disclosure.

Here, assuming that there are 2 bridge topologies (N=2) and 3 bootstrap power supply circuits in the phase unit, and the 3 bootstrap power supply circuits in the one phase unit are referred to as, according to their potentials from high to low: a first bootstrap power supply circuit (including Cboot2 and Dboot2), a second bootstrap power supply circuit (including Cboot3 and Dboot3), and a third bootstrap power supply circuit (including Cboot4 and Dboot4), exemplary illustration is made below.

When N=2 and the number of bootstrap power supply circuits in the phase unit is 3, there should be 6 hybrid connection schemes for connecting the bootstrap power supply circuits. However, for a scheme in which a parallel arrangement of the first bootstrap power supply circuit and the second bootstrap power supply circuit is connected in series with the third bootstrap power supply circuit, there is a risk of high voltage directly charging bootstrap capacitors in the first bootstrap power supply circuit and the second bootstrap power supply circuit. Therefore, such scheme should not be applied. The remaining 5 schemes are described as follows.

Figure 4:
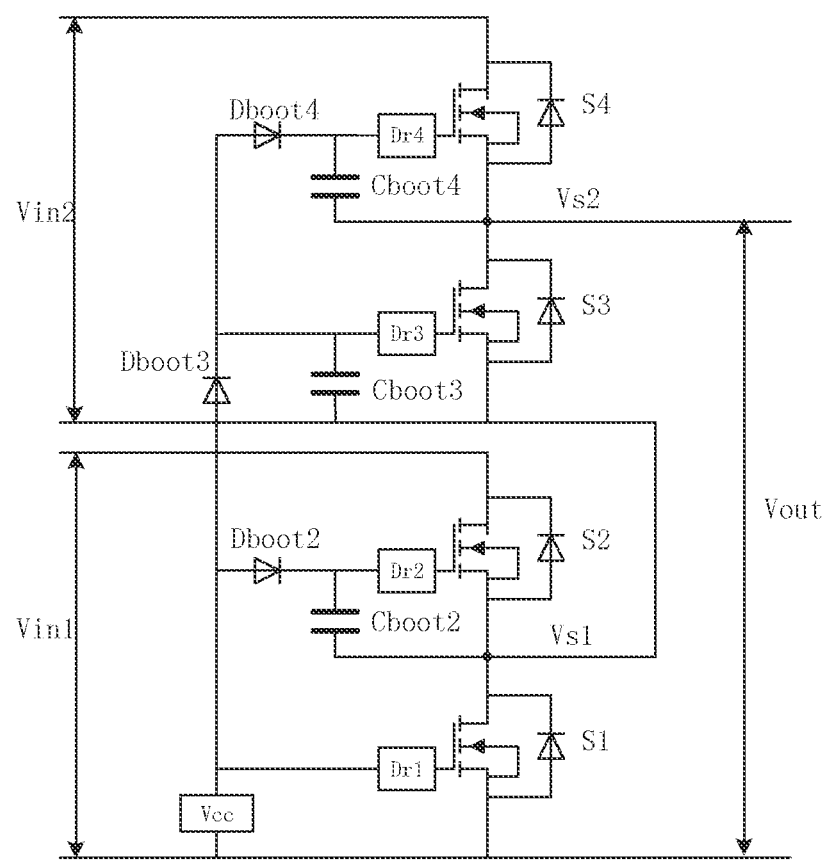
FIG. 4 is a schematic diagram of a bridge cascade system according to another embodiment of the present disclosure.

Scheme 1: as shown in FIG. 4, a series arrangement of the second bootstrap power supply circuit and the third bootstrap power supply circuit is connected in parallel with the first bootstrap power supply circuit.

Specifically, an output terminal of the driving power supply circuit Vcc is connected respectively to an input terminal of the first bootstrap power supply circuit, an input terminal of the second bootstrap power supply circuit and an input terminal of a driving circuit Dr1. An output terminal of the first bootstrap power supply circuit is connected to an input terminal of a driving circuit Dr2. An output terminal of the second bootstrap power supply circuit is connected respectively to an input terminal of a driving circuit Dr3 and an input terminal of the third bootstrap power supply circuit. An output terminal of the third bootstrap power supply circuit is connected to an input terminal of a driving circuit Dr4.

Figure 5:
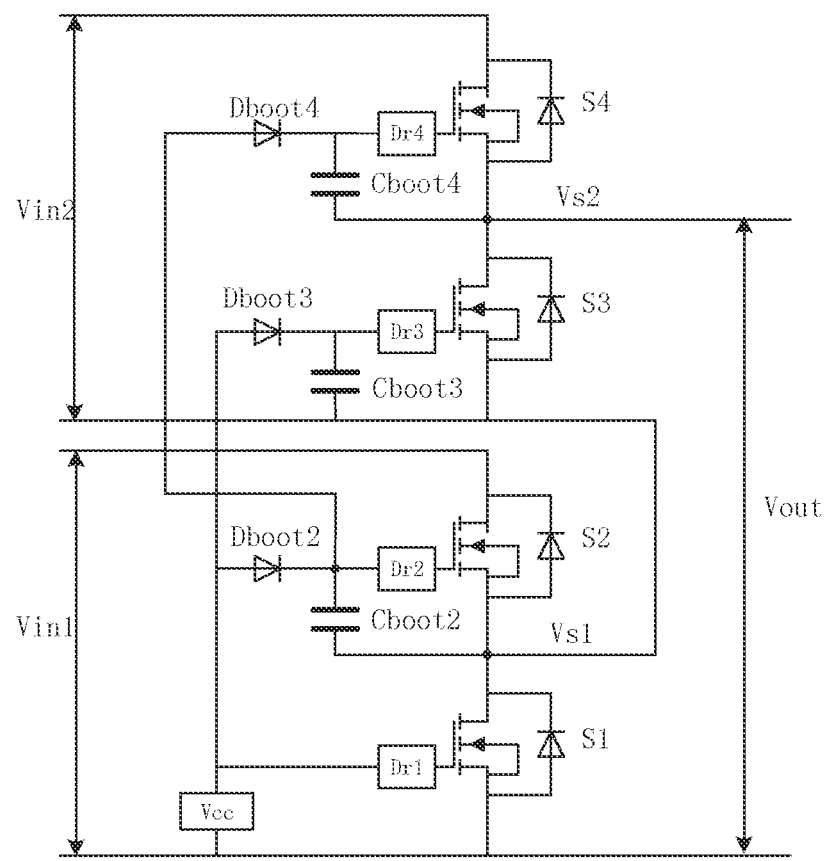
FIG. 5 is a schematic diagram of a bridge cascade system according to another embodiment of the present disclosure.

Scheme 2: as shown in FIG. 5, a series arrangement of the first bootstrap power supply circuit and the third bootstrap power supply circuit is connected in parallel with the second bootstrap power supply circuit.

Specifically, an output terminal of the driving power supply circuit Vcc is connected respectively to an input terminal of the first bootstrap power supply circuit, an input terminal of the second bootstrap power supply circuit and an input terminal of a driving circuit Dr1. An output terminal of the second bootstrap power supply circuit is connected to an input terminal of a driving circuit Dr3. An output terminal of the first bootstrap power supply circuit is connected respectively to an input terminal of a driving circuit Dr2 and an input terminal of the third bootstrap power supply circuit. An output terminal of the third bootstrap power supply circuit is connected to an input terminal of a driving circuit Dr4.

Figure 6:
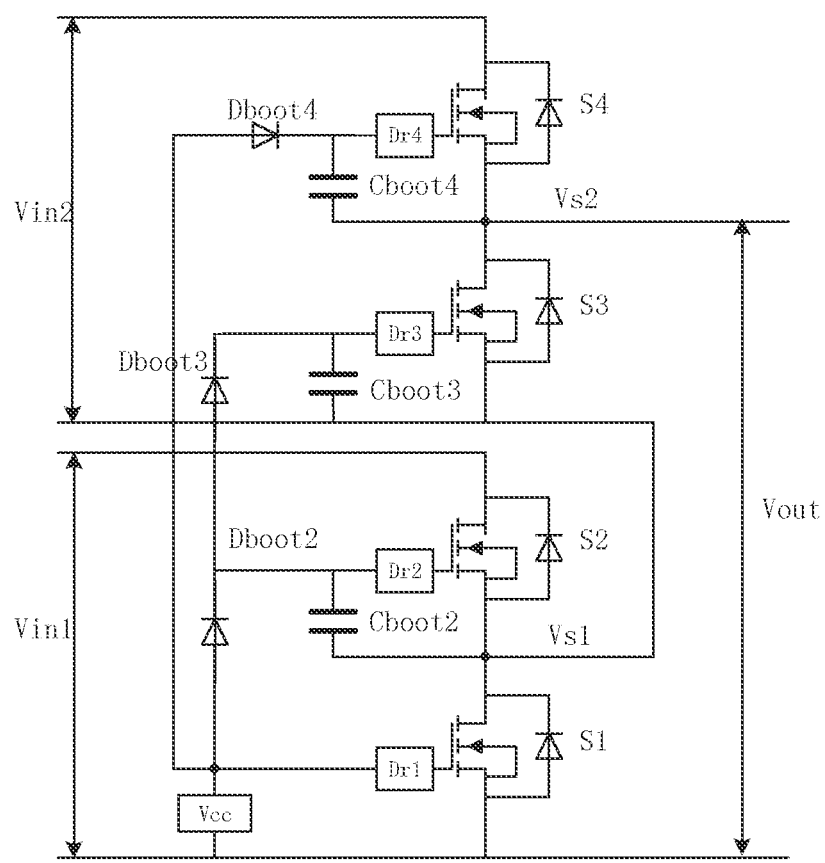
FIG. 6 is a schematic diagram of a bridge cascade system according to another embodiment of the present disclosure.

Scheme 3: as shown in FIG. 6, a series arrangement of the first bootstrap power supply circuit and the second bootstrap power supply circuit is connected in parallel with the third bootstrap power supply circuit.

Specifically, an output terminal of the driving power supply circuit Vcc is connected respectively to an input terminal of the first bootstrap power supply circuit, an input terminal of the third bootstrap power supply circuit and an input terminal of a driving circuit Dr1. An output terminal of the third bootstrap power supply circuit is connected to an input terminal of a driving circuit Dr4. An output terminal of the first bootstrap power supply circuit is connected respectively to an input terminal of a driving circuit Dr2 and an input terminal of the second bootstrap power supply circuit. An output terminal of the second bootstrap power supply circuit is connected to an input terminal of a driving circuit Dr3.

Figure 7:
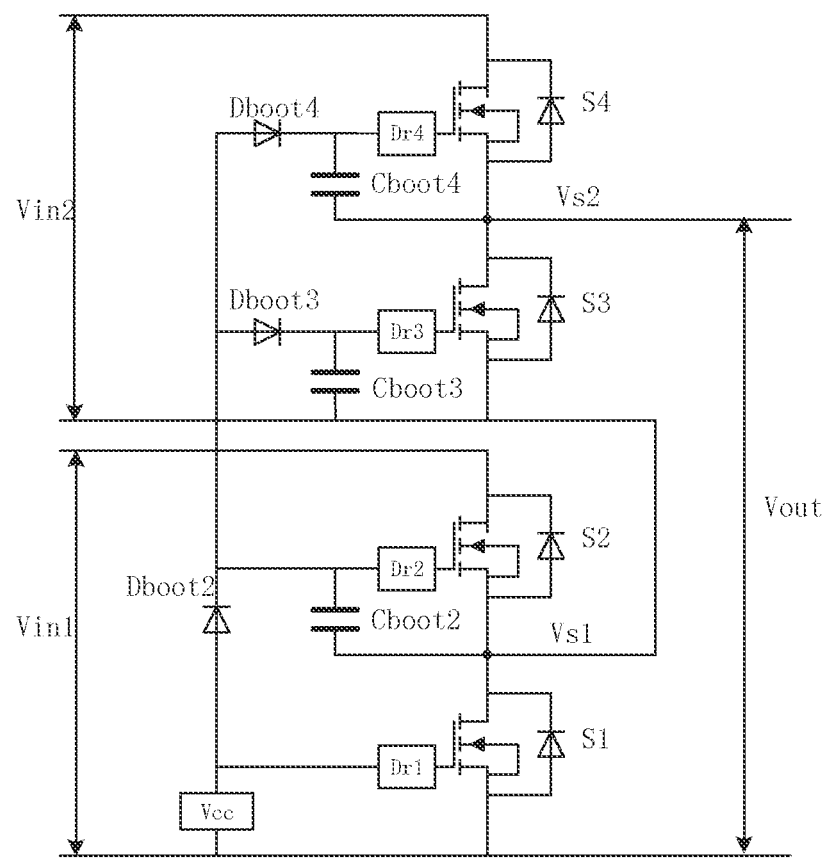
FIG. 7 is a schematic diagram of a bridge cascade system according to another embodiment of the present disclosure.

Scheme 4: as shown in FIG. 7, a parallel arrangement of the second bootstrap power supply circuit and the third bootstrap power supply circuit is connected in series with the first bootstrap power supply circuit.

Specifically, an output terminal of the driving power supply circuit Vcc is connected respectively to an input terminal of the first bootstrap power supply circuit and an input terminal of a driving circuit Dr1. An output terminal of the first bootstrap power supply circuit is connected respectively to an input terminal of a driving circuit Dr2, an input terminal of the second bootstrap power supply circuit and an input terminal of the third bootstrap power supply circuit. An output terminal of the second bootstrap power supply circuit is connected to an input terminal of a driving circuit Dr3. An output terminal of the third bootstrap power supply circuit is connected to an input terminal of a driving circuit Dr4.

Figure 8:
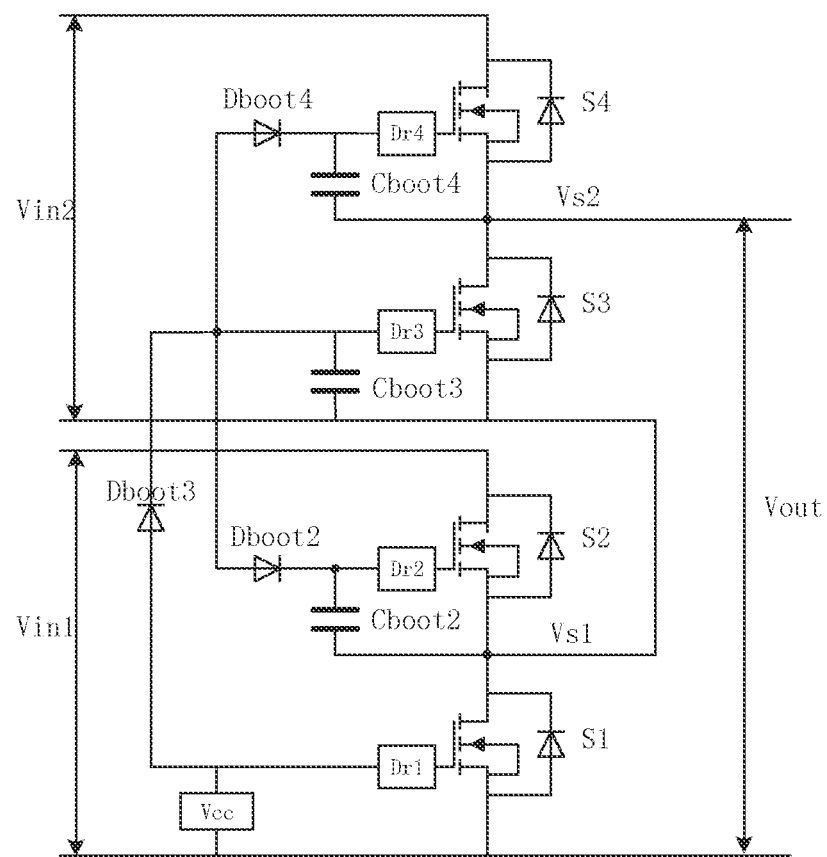
FIG. 8 is a schematic diagram of a bridge cascade system according to another embodiment of the present disclosure.

Scheme 5: as shown in FIG. 8, a parallel arrangement of the first bootstrap power supply circuit and the third bootstrap power supply circuit is connected in series with the second bootstrap power supply circuit.

Specifically, an output terminal of the driving power supply circuit Vcc is connected respectively to an input terminal of the second bootstrap power supply circuit and an input terminal of a driving circuit Dr1. An output terminal of the second bootstrap power supply circuit is connected respectively to an input terminal of a driving circuit Dr3, an input terminal of the third bootstrap power supply circuit and an input terminal of the first bootstrap power supply circuit. An output terminal of the first bootstrap power supply circuit is connected to an input terminal of a driving circuit Dr2. An output terminal of the third bootstrap power supply circuit is connected to an input terminal of a driving circuit Dr4.

The above descriptions are all made based on an example where N=2. When N is greater than or equal to 3, structures are similar to the above and are not described in detail herein, and shall fall within the protection scope of the present disclosure.

In a case where N=3, there are multiple connection configurations, one of which is described below.

It is assumed that there are 5 bootstrap power supply circuits in the phase unit. The 5 bootstrap power supply circuits are referred to as, according to their potentials from high to low: a first bootstrap power supply circuit (including Cboot2 and Dboot2 as shown in FIG. 9), a second bootstrap power supply circuit (including Cboot3 and Dboot3 as shown in FIG. 9), a third power supply circuit (including Cboot4 and Dboot4 as shown in FIG. 9), a fourth bootstrap power supply circuit (including Cboot5 and Dboot5 as shown in FIG. 9), and a fifth bootstrap power supply circuit (including Cboot6 and Dboot6 as shown in FIG. 9).

Figure 9:
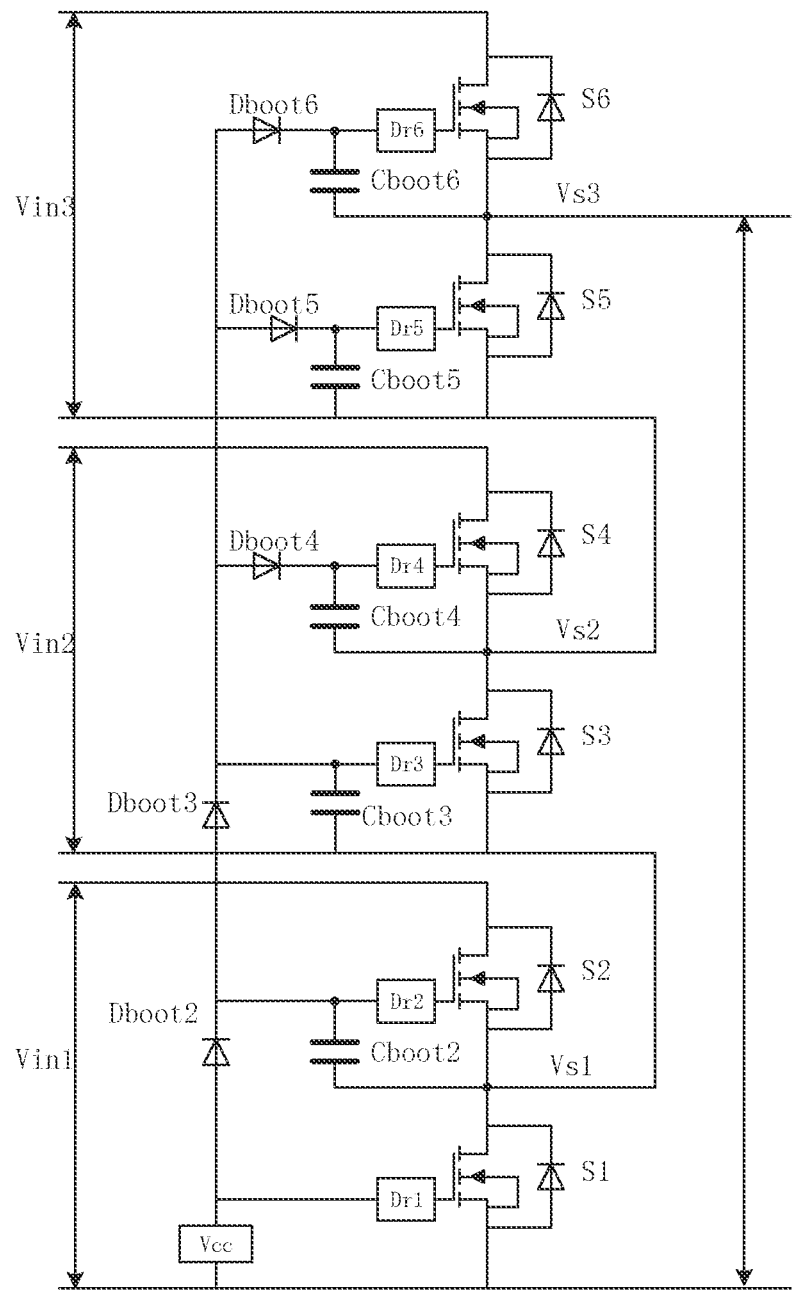
FIG. 9 is a schematic diagram of a bridge cascade system according to another embodiment of the present disclosure.

Specifically, as shown in FIG. 9, an output terminal of the driving power supply circuit Vcc is connected respectively to an input terminal of the first bootstrap power supply circuit and an input terminal of a driving circuit Dr1. An output terminal of the first bootstrap power supply circuit is connected respectively to an input terminal of a driving circuit Dr2 and an input terminal of the second bootstrap power supply circuit. An output terminal of the second bootstrap power supply circuit is connected respectively to an input terminal of the third bootstrap power supply circuit, an input terminal of the fourth bootstrap power supply circuit, an input terminal of the fifth bootstrap power supply circuit and an input terminal of a driving circuit Dr3. An output terminal of the third bootstrap power supply circuit is connected to an input terminal of a driving circuit Dr4. An output terminal of the fourth bootstrap power supply circuit is connected to an input terminal of a driving circuit Dr5. An output terminal of the fifth bootstrap power supply circuit is connected to an input terminal of a driving circuit Dr6.

It should be noted that the possibility of schemes for bootstrap power supply circuits connected in a hybrid manner of cascading connection and parallel connection increases with the increase of the number of bootstrap power supply circuits, that is, the larger N is, the more possibilities there are for connecting the bootstrap power supply circuits.

Other connection configurations of the bootstrap power supply circuits when N is equal to 3 or another value are not described in detail herein, and all shall fall within the protection scope of the present disclosure.

It should be noted that, as shown in FIGS. 2-9, the bootstrap diodes and bootstrap capacitors are used to illustrate a principle of the bootstrap power supply circuits, which do not represent actual circuits. The specific structure of the bootstrap power supply circuits depends on an actual situation and is not specifically limited herein, and shall fall within the protection scope of the present disclosure.

In this embodiment, the variety of combinations of bootstrap power supply circuits in a phase unit may facilitate device selection and design optimization.

It should be noted that when N=2, a high-voltage side switch transistor of a first bridge topology and a low-voltage side switch transistor of a second bridge topology share a source electrode, and bootstrap power supply circuits corresponding thereto share a ground, or the two may share a same bootstrap power supply circuit. From this perspective, in the bridge cascade system, two driving circuits may reuse one bootstrap power supply circuit, so as to reduce the number of devices in the system, especially reduce the number of bootstrap diodes, or even bootstrap capacitors. Meanwhile, the bootstrap power supply is simplified. In this case, attention should pay to a reverse voltage stress of a corresponding bootstrap diode, with which the charge support capability of the bootstrap capacitor is adjusted accordingly.

For any one of the above embodiments, arbitrary two driving circuits in a same phase unit may reuse one bootstrap power supply circuit.

In other words, the number of bootstrap power supply circuits in the phase unit is less than 2N−1. For example, when N=3, the number of bootstrap power supply circuits in the phase unit is 2 or 1. It should be further noted that for the situation where every two driving circuits reuse one bootstrap power supply circuit, the number of bootstrap power supply circuits would be equal to the value of subtracting 1 from 2N−1.

Specifically, in the phase unit, a bootstrap power supply circuit is reused by a low-voltage side driving circuit in one of two bridge topologies that has higher potential and a high-voltage side driving circuit in the other one of the two bridge topologies that has lower potential.

Based on the structure shown in FIG. 3, the bootstrap diode Dboot2 of the first bootstrap power supply circuit may be reused by the bootstrap capacitor Cboot2 of the first bootstrap power supply circuit and the bootstrap capacitor Cboot3 of the second bootstrap power supply circuit. Therefore, The bootstrap diode Dboot3 of the second bootstrap power supply circuit may be omitted. Furthermore, it is possible to use only one bootstrap capacitor, and a reuse of cascaded bootstrap power supply scheme is shown in FIG. 10.

Figure 10:
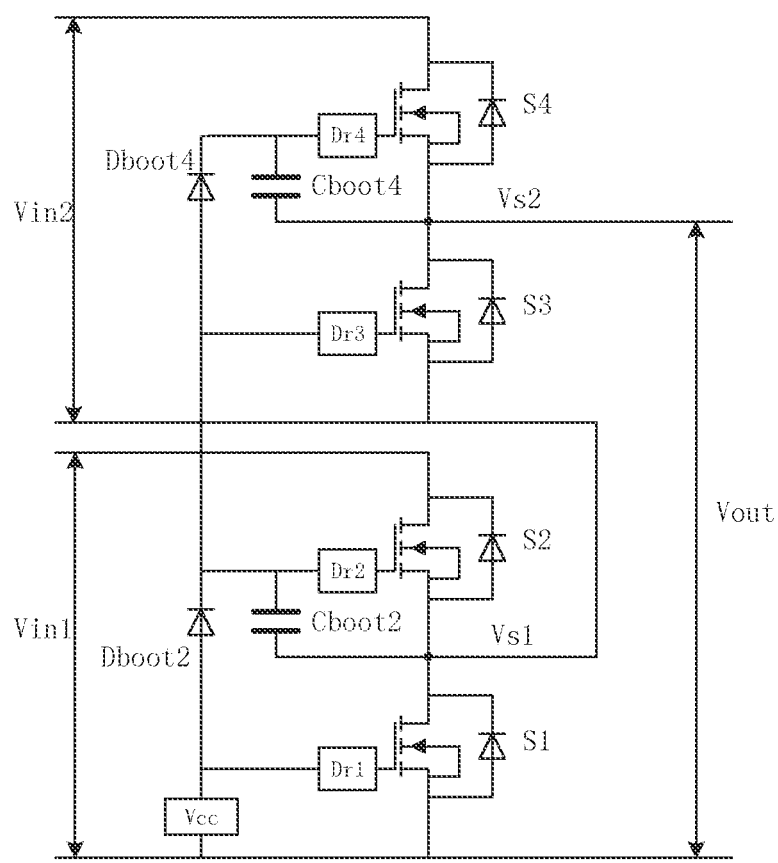
FIG. 10 is a schematic diagram of a bridge cascade system according to another embodiment of the present disclosure.

Referring to FIG. 10, there are 2 bridge topologies (N=2), and a first bootstrap power supply circuit (including Cboot2 and Dboot2 as shown in FIG. 10) is reused by a driving circuit Dr3 and a driving circuit Dr2; that is, an output terminal of the first bootstrap power supply circuit is directly connected to an input terminal of the driving circuit Dr3 and an input terminal of the driving circuit Dr2, respectively.

Based on the structure shown in FIG. 4, the bootstrap diode Dboot2 of the first bootstrap power supply circuit may be reused by the bootstrap capacitor Cboot2 of the first bootstrap power supply circuit and the bootstrap capacitor Cboot3 of the second bootstrap power supply circuit. Therefore, The bootstrap diode Dboot3 of the second bootstrap power supply circuit may be omitted. Furthermore, it is possible to use only one bootstrap capacitor (not shown in the drawings).

For the bridge cascade system including 2 bridge topologies (N=2), in a bootstrap power supply circuit scheme in which the bootstrap power supply circuits are connected in a hybrid manner of cascading connection and parallel connection, if one bootstrap power supply circuit is reused, there are only 2 bootstrap power supply circuits in the system, that is, there could be either the cascading connection or the parallel connection. Therefore, when N=2 and there is a reused bootstrap power supply circuit, hybrid connection configurations of the bootstrap power supply circuits is not feasible.

When there is reuse of bootstrap power supply circuit(s) and there are more than two bootstrap power supply circuits, it is possible to implement a hybrid scheme of cascading connection and parallel connection. By virtue of reuse of bootstrap power supply circuit(s), the system shown in FIG. 9 may be simplified as that shown in FIG. 11.

Figure 11:
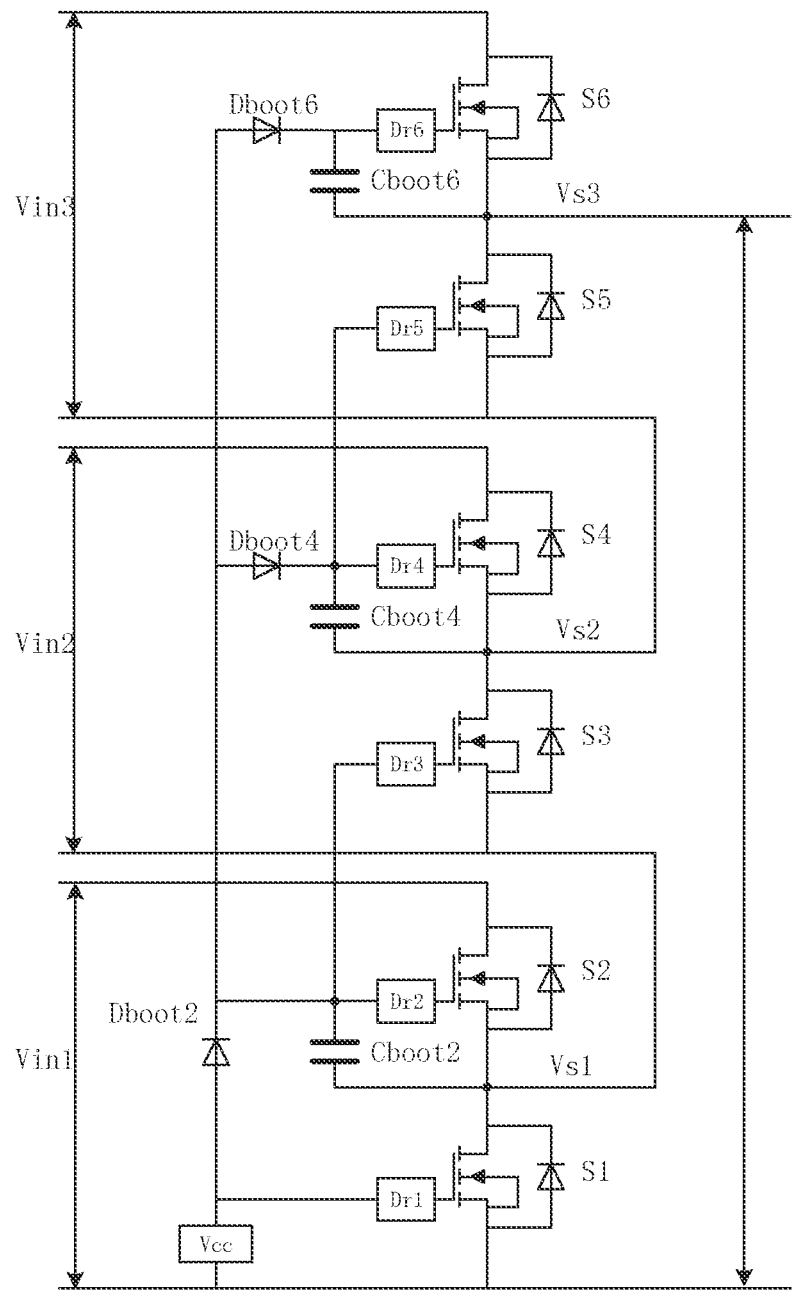
FIG. 11 is a schematic diagram of a bridge cascade system according to another embodiment of the present disclosure.

Referring to FIG. 11, there are 3 bridge topologies (N=3), and a first bootstrap power supply circuit (including Cboot2 and Dboot2 as shown in FIG. 11) is reused by a driving circuit Dr3 and a driving circuit Dr2; that is, an output terminal of the first bootstrap power supply circuit is directly connected to an input terminal of the driving circuit Dr3 and an input terminal of the driving circuit Dr2, respectively. Besides, a second bootstrap power supply circuit (including Cboot4 and Dboot4 as shown in FIG. 11) is reused by a driving circuit Dr5 and a driving circuit Dr4; that is, an output terminal of the second bootstrap power supply circuit is directly connected to an input terminal of the driving circuit Dr4 and an input terminal of the driving circuit Dr5, respectively.

It should be noted that other implementations for reuse of bootstrap power supply circuit(s) are not described in detail herein, and all shall fall within the protection scope of the present disclosure.

In the embodiments, by providing bootstrap power supply circuits to replace multiple isolated power supplies and reusing one or more of the bootstrap power supply circuits, the system may be simplified, the number of devices to be applied may be reduced, and the cost for the bridge cascade system may be reduced.

In the embodiments shown in FIGS. 2-11, bridge topologies in the phase unit are cascaded on AC sides by a common source electrode. In addition to the above manner of cascading by a common source electrode, another manner of cascading is also possible in practical applications, such as cascading by a common drain electrode.

That is, in the phase unit, bridge topologies are cascaded on AC sides by a common source electrode or by a common drain electrode.

Specifically, as shown in FIGS. 2-11, the bridge topologies in the phase unit are cascaded on AC sides by a common source electrode. Taking the structure shown in FIG. 2 as an example, a source of a switch transistor S3 in a second bridge topology is connected to a source of a switch transistor S2 in a first bridge topology.

Figure 12:
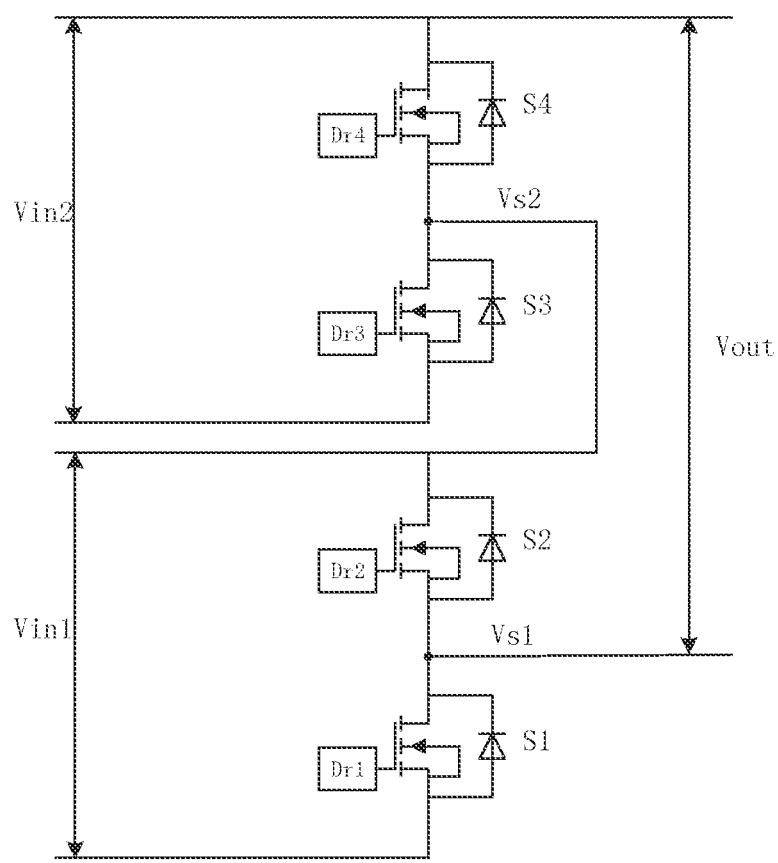
FIG. 12 is a schematic diagram of a bridge cascade system according to another embodiment of the present disclosure.
Figure 13:
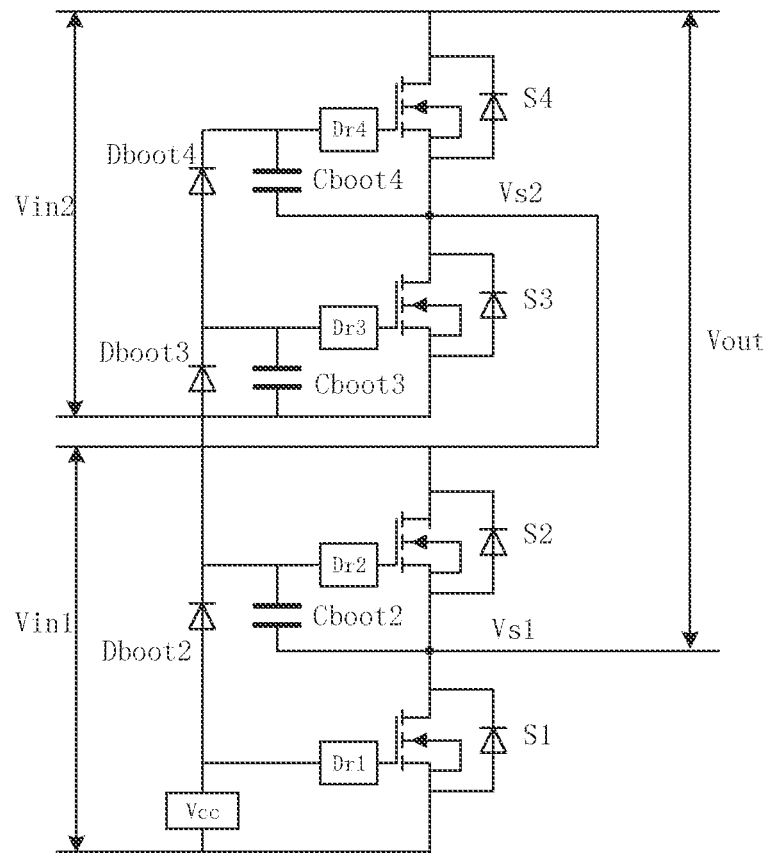
FIG. 13 is a schematic diagram of a bridge cascade system according to another embodiment of the present disclosure.
Figure 14:
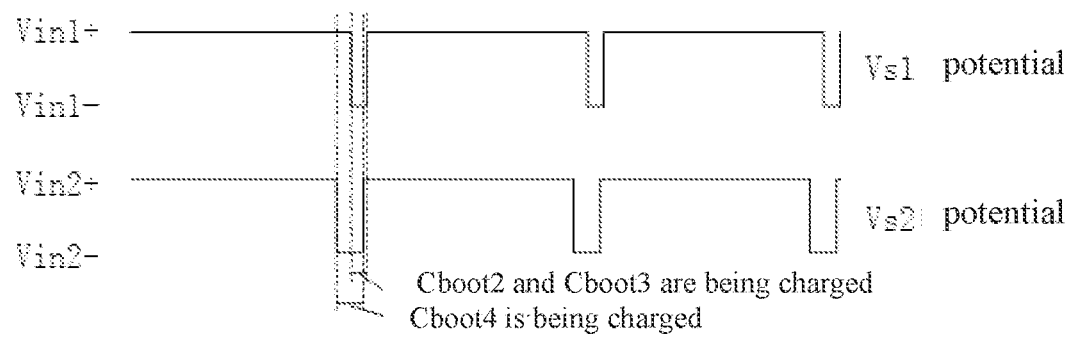
FIG. 14 is a schematic diagram of a neutral point potential of a bridge topology in a bridge cascade system according to an embodiment of the present disclosure.

As shown in FIG. 12 and FIG. 13, bridge topologies in the phase unit are cascaded on AC sides by a common drain electrode. Taking the structure shown in FIG. 13 as an example, a drain of a switch transistor S2 in a first bridge topology is connected to a drain of a switch transistor S3 in a second bridge topology.

In any of the foregoing embodiments, the bootstrap power supply circuit includes a bootstrap diode (Dboot2, Dboot3, or Dboot4 as shown in FIG. 2) and a bootstrap capacitor (Cboot2, Cboot3, or Cboot4 as shown in FIG. 2).

A cathode of the bootstrap diode is connected to a terminal of the bootstrap capacitor, and a connecting point is used as an output terminal of a corresponding bootstrap power supply circuit. An anode of the bootstrap diode is used as an input terminal of the corresponding bootstrap power supply circuit. Another terminal of the bootstrap capacitor is connected to a source of a corresponding switch transistor.

As shown in FIG. 2, taking the first bootstrap power supply circuit as an example, a cathode of the bootstrap diode Dboot2 is connected to a terminal of the bootstrap capacitor Cboot2, and a connecting point is used as an output terminal of the first bootstrap power supply circuit. An anode of the bootstrap diode Dboot2 is used as an input terminal of the first bootstrap power supply circuit. Another terminal of the bootstrap capacitor Cboot2 is connected to a source of the switch transistor S1.

In any of the foregoing embodiments, in the phase unit, the driving circuit of the bridge topology with the lowest potential is directly connected to the driving power supply circuit. As shown in FIG. 2, the input terminal of the driving circuit Dr1 is directly connected to the output terminal of the driving power supply circuit Vcc.

It should be noted that the main differences between a case where the bootstrap power supply circuits are connected in parallel and a case where the bootstrap power supply circuits are connected in series lie in that: timings of charge refresh for the bootstrap capacitors are different and reverse voltage stress of the bootstrap diodes is different. In the case where the bootstrap power supply circuits are connected in parallel, when a bootstrap diode is reversely biased, a reverse withstand voltage is determined by voltage across from the driving circuit where the bootstrap diode is located to the driving power supply circuit Vcc, which indicates that different bootstrap diodes have different reverse withstand voltages. Specifically, the higher the bootstrap diode located, the higher the withstand voltage of the bootstrap diode. In the case where the bootstrap power supply circuits are connected in series, when a bootstrap diode is reversely biased, the reverse withstand voltage is determined by voltage difference across from the driving circuit where the bootstrap diode is located to a previous driving circuit. Correspondingly, by comprehensively considering factors of device selection and cost, it may be determined whether to apply serial connection, parallel connection or a combination of both serial connection and parallel connection to the bootstrap power supply circuits.

For the bridge cascade system shown in FIG. 2 in which the bootstrap power supply circuits are connected in series, a negative bus of the second bridge topology is connected to a neutral point of a bridge arm of the first bridge topology, that is, the switch transistor S2 and the switch transistor S3 have a common source electrode. The low-voltage side switch transistor S1 of the first bridge topology is powered by the driving power supply circuit Vcc alone, and other switch transistors (S2, S3 and S4 as shown in FIG. 2) are powered by the driving power supply circuit Vcc via corresponding bootstrap power supply circuits. The bootstrap power supply circuits are cascaded, that is, the bootstrap power supply circuits are connected in series. The bootstrap capacitors corresponding to the switch transistor S2 and the switch transistor S3 are charged when the neutral point potential Vs1 of the bridge arm of the first bridge topology is pulled down. Generally, the neutral point potential Vs1 is pulled down by turning on the switch transistor S1. The bootstrap capacitor corresponding to the switch transistor S4 is charged when the neutral point potential Vs2 of the bridge arm of the second bridge topology is pulled down. Generally, the neutral point potential Vs2 is pulled down by turning on the switch transistor S3. During a non-charging period, the bootstrap diode is reversely biased, the bootstrap capacitors are disconnected from the driving power supply Vcc, and each of the bootstrap capacitors powers a corresponding driving circuit.

For the structure of the complementary half-bridge system shown in FIG. 3 in which the bootstrap power supply circuits are connected in parallel, the power supply scheme of the bootstrap power supply circuits is different from the structure shown in FIG. 2 in that the bootstrap power supply circuits are connected in parallel.

Specifically, as shown in FIG. 3, the bootstrap capacitors corresponding to the switch transistor S2 and the switch transistor S3 are charged when the neutral point potential Vs1 is pulled down. For the bootstrap capacitor Cboot4 corresponding to the switch transistor S4, in order to make the bootstrap diode Dboot4 forward biased, the neutral point potential Vs2 is required to be pulled down to the potential of a ground terminal of the driving power supply circuit Vcc, that is, Vin−. Therefore, the bootstrap capacitor Cboot4 is charged when the neutral point potential Vs1 and the neutral point potential Vs2 potential are both pulled down. Correspondingly, there are four working status of the second bridge topology and the first bridge topology. The charging timing of the bootstrap capacitor changes due to a change of the conditions for charging the bootstrap capacitor, which also indicates that the charge support capability of the bootstrap capacitors is adjusted accordingly.

In any of the above embodiments, the complementary half-bridge cascade system further includes a controller.

The controller is configured to control through each driving circuit to make each bridge topology in each phase unit work in a corresponding working mode.

Figure 20:
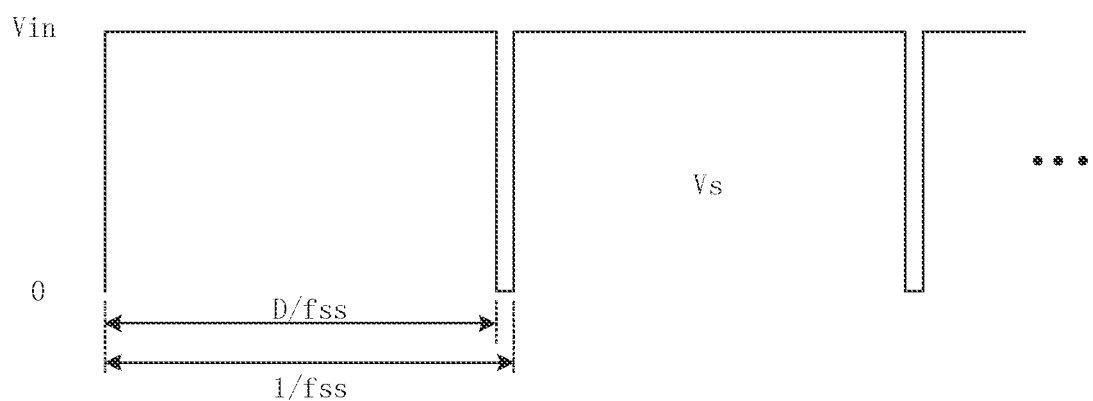
FIG. 20 is a schematic diagram of a neutral point potential of a bridge topology in a bridge cascade system according to another embodiment of the present disclosure.

In practical applications, each bridge topology in a same phase unit is controlled to work in either a chopping mode or a pseudo continuous conduction mode (PCCM); and the low-voltage side switch transistor in the bridge topology working in the pseudo continuous conduction mode is intermittently turned on. FIG. 20 shows a refresh timing of the bootstrap capacitor when the neutral point potential of a corresponding bridge arm is switched in the pseudo continuous conduction mode. In FIG. 20, D represents a duty cycle of the high-voltage side switch in a corresponding bridge topology, fss represents a state switching frequency in the pseudo continuous conduction mode; Vin represents an input voltage of the corresponding bridge topology; and Vs represents a neutral point potential of a corresponding bridge arm.

Three situations are described below.

(1) The controller controls the bridge topologies in the phase unit to all work in the chopping mode or to all work in the pseudo continuous conduction mode, so as to make the bootstrap power supply circuits in the phase unit be charged in one cycle.

It should be noted that when there are at least two bootstrap circuits connected in parallel in the phase unit, the chopping waveforms of the respective bridge topologies do not completely overlap with each other, so as to make the bootstrap power supply circuits in the phase unit be charged in one cycle. When there are bootstrap circuits connected in series in the phase unit, the chopping waveforms of the respective bridge topologies may be completely overlapped or not completely overlapped, which depends on an actual situation and is not specifically limited herein, and all shall fall within the protection scope of the present disclosure.

Specifically, the controller controls bridge topologies in the phase unit to all work in the chopping mode, and controls the chopping waveforms of the bridge topologies in the phase unit to not completely overlap with each other, so as to make the bootstrap power supply circuits in the phase unit be charged in one cycle; or otherwise, the controller controls bridge topologies in the phase unit to all work in the pseudo continuous conduction mode, and controls the chopping waveforms of the bridge topologies in the phase unit to not completely overlap with each other, so as to make the bootstrap power supply circuits in the phase unit be charged in one cycle.

In more detail, the controller controls bridge topologies in the phase unit to all work in the pseudo continuous conduction mode, so as to make the bootstrap power supply circuits in the phase unit be charged in one cycle.

It should be noted that in the phase unit, the duty cycle of the bridge topology with high potential may be greater or less than that of the bridge topology with low potential, which depends on an actual situation and is not specifically limited herein, and all shall fall within the protection scope of the present disclosure.

When the bootstrap power supply circuits are connected in series, there are various processes for the controller to control each bridge topology in the phase unit to work in the chopping mode or the pseudo continuous conduction mode. The following description is made by referring to an example where N=2 and there are 3 bootstrap power supply circuits in the phase unit.

Case 1: a first bridge topology and a second bridge topology are in the pseudo continuous conduction mode Specifically, when the high-voltage side switch transistor of the first bridge topology and the high-voltage side switch transistor of the second bridge topology both require to be conducted, the pseudo continuous conduction mode is applied in place of a conduction mode to realize a charge refresh of the bootstrap capacitors. A condition for the charge refresh of the bootstrap capacitors is the same as that for the first working state, and a timing of the charge refresh is shown as in FIG. 14. During a non-charging period, the voltage of the bootstrap capacitors are required to be able to support a normal operation of respective driving circuits, and a low-level bootstrap capacitor needs to have certain charge support ability when charging a high-level bootstrap capacitor.

Case 2: a first bridge topology and a second bridge topology are in the chopping mode.

Figure 15:
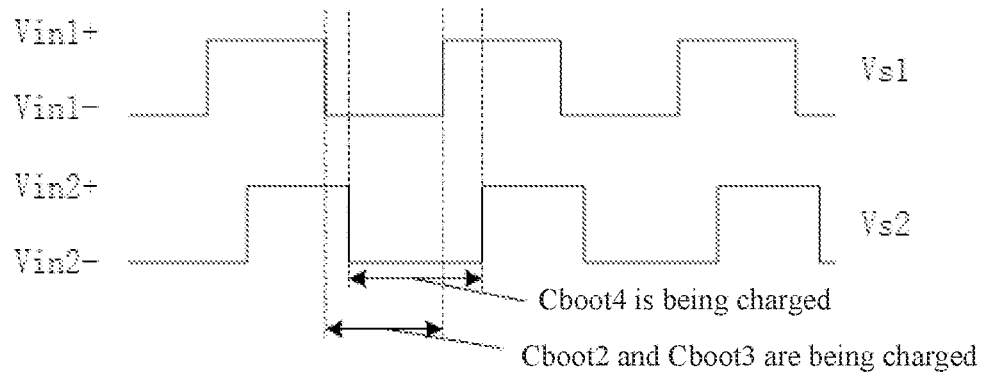
FIG. 15 is a schematic diagram of a neutral point potential of a bridge topology in a bridge cascade system according to another embodiment of the present disclosure.

Specifically, as shown in FIG. 2, the switch transistor S1 is powered by the driving power supply circuit Vcc alone. When switch transistor S1 is turned on, the driving power supply circuit Vcc charges the bootstrap capacitor Cboot2 and the bootstrap capacitor Cboot3. When switch transistor S3 is turned on, the driving power supply circuit Vcc also charges the bootstrap capacitor Cboot4 if switch transistor S1 is turned on; and the bootstrap capacitor Cboot2 and the bootstrap capacitor Cboot3 charge the bootstrap capacitor Cboot4 if switch transistor S2 is turned on. FIG. 15 illustrates a specific example of the refresh timing of the bootstrap capacitors when the neutral point potentials of the bridge arms of the first bridge topology and the second bridge topology are switched. The first bridge topology and the second bridge topology may be at different frequencies; however, during a non-charging period, the voltage of the bootstrap capacitors is required to be able to support the normal operation of respective driving circuits, and especially a low-level bootstrap capacitor needs to have certain charge support ability when charging a high-level bootstrap capacitor.

(2) The controller controls at least one bridge topology in the phase unit to work in the chopping mode and at least one bridge topology in the phase unit to work in the pseudo continuous conduction mode, so as to make the bootstrap power supply circuits in the phase unit be charged in one cycle.

When the bootstrap power supply circuits are connected in series, there are various processes for the controller to control each bridge topology in the phase unit to work in the chopping mode or the pseudo continuous conduction mode. The following description is made by referring to an example where N=2 and there are 3 bootstrap power supply circuits in the phase unit.

Case 1: A first bridge topology in the chopping mode and a second bridge topology in the pseudo continuous conduction mode.

Figure 16:
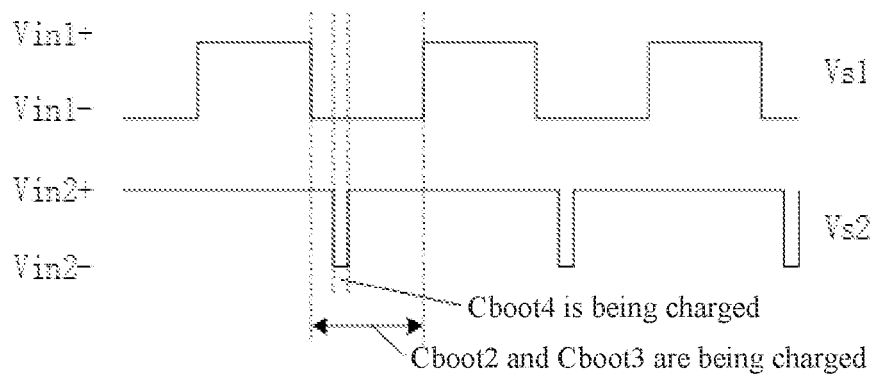
FIG. 16 is a schematic diagram of a neutral point potential of a bridge topology in a bridge cascade system according to another embodiment of the present disclosure.
Figure 17:
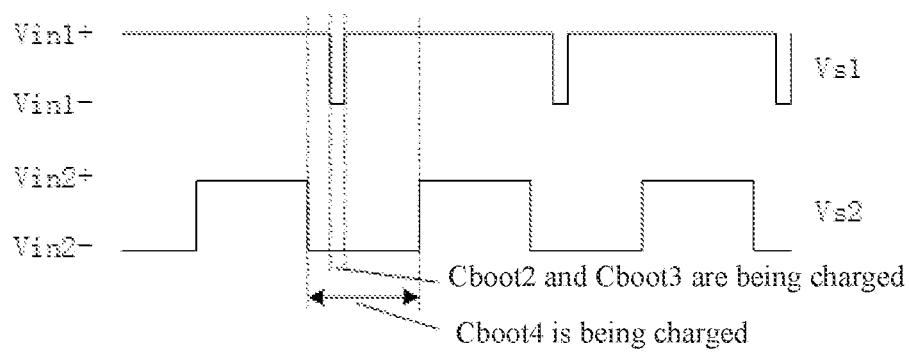
FIG. 17 is a schematic diagram of a neutral point potential of a bridge topology in a bridge cascade system according to another embodiment of the present disclosure.

Specifically, referring back to FIG. 2, when the high-voltage side switch transistor of the second bridge topology requires to be conducted, the pseudo continuous conduction mode is applied in place of a conduction mode to realize a charge refresh of the bootstrap capacitors. A main purpose of the second bridge topology working in the pseudo continuous conduction mode in which the low-voltage side switch transistor is turned on instead is to charge the bootstrap capacitor Cboot4. A condition for charge refresh of the capacitors is the same as the mode described in (1) as above. A specific example of the capacitor refresh timing is shown in FIG. 16. Similarly, during a non-charging period, the voltage of the bootstrap capacitors are required to be able to support a normal operation of respective driving circuits, and a low-level bootstrap capacitor needs to have certain charge support ability when charging a high-level bootstrap capacitor.

Case 2: A first bridge topology in the pseudo continuous conduction mode and a second bridge topology in the chopping mode.

Specifically, referring back to FIG. 2, when the high-voltage side switch transistor of the first bridge topology requires to be conducted, the pseudo continuous conduction mode is applied in place of a conduction mode to realize a charge refresh of the bootstrap capacitors. A condition for the charge refresh is the same as that has described above, and a timing of the charge refresh is shown as in FIG. 17. The switch transistor S1 has a short conduction time. It should be noted that during a non-charging period, the voltage of the bootstrap capacitors are required to be able to support a normal operation of respective driving circuits, and a low-level bootstrap capacitor needs to have certain charge support ability when charging a high-level bootstrap capacitor.

Figure 18:
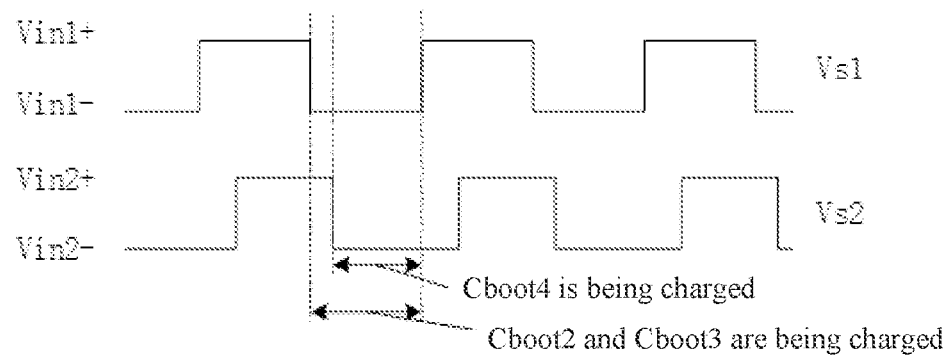
FIG. 18 is a schematic diagram of a neutral point potential of a bridge topology in a bridge cascade system according to another embodiment of the present disclosure.

It should be noted that for a bridge cascade system with a structure as shown in FIG. 3, in which the bootstrap power supply circuits are connected in parallel, if the second bridge topology and the first bridge topology are both in the chopping mode, the timing diagram is as shown FIG. 18, rather than that shown in FIG. 15. In other working modes, the timing may be analyzed with reference to FIG. 16, FIG. 17, and FIG. 14, which is not described in detail herein, and all shall fall within the protection scope of the present disclosure.

In the bridge cascade system, when bootstrap power supply circuits are connected in a hybrid configuration of serial connection and parallel connection, there may be situations based on the conditions for charging the bootstrap capacitors and the working modes of the first bridge topology and the second bridge topology, which are not described in detail herein, and all shall fall within the protection scope of the present disclosure.

It should be noted that in FIGS. 2-20, Vin, Vin1, Vin2, and Vin3 each represent a input end voltage of a corresponding bridge topology, and Vin1+, Vin1−, Vin2+, Vin2− and Vin3+, Vin3− each represent a voltage of electrodes at an input end of a corresponding bridge topology; and Vs, Vs1, Vs2, and Vs3 each represent a neutral point potential of a bridge arm of a corresponding bridge topology.

The above description is based on the case where bridge topologies in a phase unit are cascaded by a common source electrode. Hereinafter, a power supply relationship of a case where the bridge topologies in the phase unit are cascaded by a common drain electrode is described.

It should be noted that when the bridge topologies in the phase unit are cascaded by a common drain electrode, in the phase unit, the high-voltage side switch transistors of two adjacent bridge topologies should not be both turned on, in order to avoid too large voltage on a corresponding bootstrap capacitor.

Specifically, as shown in FIG. 13, when switch transistor S1 is turned on, the driving power supply circuit Vcc charges the bootstrap capacitor Cboot2 via the bootstrap diode Dboot2, and the bootstrap diode Dboot3 and the bootstrap diode Dboot4 are reversely biased. When switch transistor S2 is turned on, the bootstrap diode Dboot2 is reversely biased. At this time, if switch transistor S3 is turned on, the bootstrap diode Dboot3 and the bootstrap diode Dboot4 are both forward biased, the bootstrap capacitor Cboot2 charges the bootstrap capacitor Cboot3 and the bootstrap capacitor Cboot4, and the bootstrap capacitor Cboot2 has sufficient charge support capacity; or otherwise, if switch transistor S4 is turned on, the potential Vs1 is pulled up to a positive bus of Vin2, and the bootstrap capacitor Cboot3 is applied with an input voltage of Vin2, which is apparently undesirable.

Therefore, following tow solutions may be applied.

Figure 19:
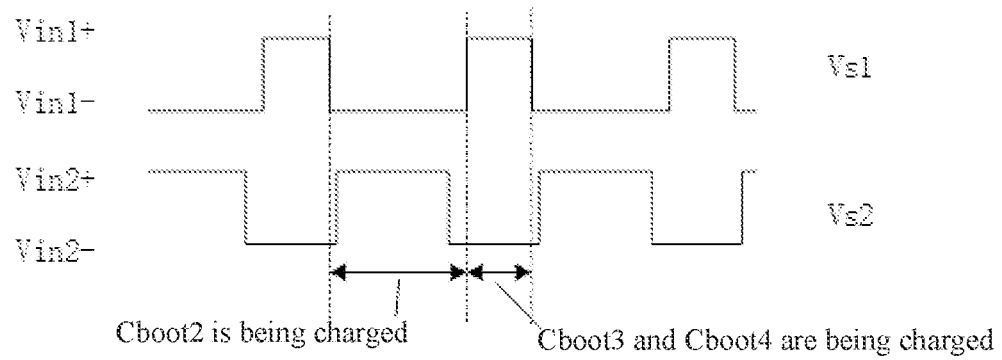
FIG. 19 is a schematic diagram of a neutral point potential of a bridge topology in a bridge cascade system according to another embodiment of the present disclosure.

Solution 1: Avoiding turning on both the switch transistor S2 and the switch transistor S4, of which a possible timing waveform is shown in FIG. 19.

Solution 2: Arranging a dedicated bootstrap power supply circuit for bootstrap capacitor Cboot3, where the dedicated bootstrap power supply circuit automatically disconnects from bootstrap capacitor Cboot2 when switch transistor S4 is turned on.

For the above-mentioned cascade arrangements, there are many other designs of bootstrap power supply circuits between the bridge topologies, and the above is only an example.

For other cascading arrangements, even for different types of power devices such as PMOS transistors, IGBT transistors and the like, a bridge cascade system may be designed using the concept provided in the present disclosure. Specific design may be carried on by reference to the analysis with regard to the common source cascade system, which is not described in detail, and all shall fall within the protection scope of the present disclosure.

The features described in embodiments of the present disclosure may be replaced or combined with each other, the same or similar parts among the embodiments can be referred to each other, and each embodiment places emphasis on the difference from another embodiment. In particular, for the system or the embodiment of the system, since they are similar to the embodiment of the method, the description of the system or the embodiment of the system is simple, and reference may be made to the relevant part of the embodiment of the method. The above system and the above system embodiment are only illustrative. The units described as separate components may be or may not be separated physically, and the components shown as units may be or may not be physical units, that is, the units may be located at the same position or may be distributed onto multiple network units. Some or all modules thereof may be selected based on an actual requirement, to implement an objective of the solution in the current embodiment. Those skilled in the art may understand and implement the present disclosure without any creative effort.

It is further understood by those skilled in the art that units and algorithm steps described in combination with the disclosed embodiments may be implemented by electronic hardware, computer software or a combination thereof. In order to clearly describe interchangeability of the hardware and the software, configurations and the steps are generally described above based on functions. Determination regarding implementing the functions by the hardware or the software may depend on specific applications of the technical solutions and design constraints. For each of the specific applications, those skilled in the art may adopt a specific implementation to implement the functions described above, and the implementation should fall within the scope of the present disclosure.

Based on the above description of the disclosed embodiments, those skilled in the art may implement or use the present disclosure. Many modifications to these embodiments are apparent for those skilled in the art. The general principles defined herein may be applied to other embodiments without departing from the spirit or scope of the present disclosure. Therefore, the present disclosure is not limited to the embodiments illustrated herein, but is defined by the widest scope consistent with the principles and novel features disclosed herein.

The invention claimed is:

1. A bridge cascade system comprising at least one phase unit and a driving unit for the phase unit, wherein:
   the phase unit comprises N bridge topologies cascaded on alternating current AC sides, where N is an integer greater than 1;
   the driving unit comprises one driving power supply circuit, a plurality of bootstrap power supply circuits and 2N driving circuits;
   in the phase unit, the driving power supply circuit powers the driving circuits directly or through corresponding bootstrap power supply circuits; and
   the driving circuits are configured to provide driving signals for corresponding switch transistors in the phase unit.

2. The bridge cascade system according to claim 1, wherein the bootstrap power supply circuits in the phase unit are connected in parallel.

3. The bridge cascade system according to claim 1, wherein the bootstrap power supply circuits in the phase unit are connected in series.

4. The bridge cascade system according to claim 3, wherein:
   the bootstrap power supply circuits in the phase unit are sequentially connected in series according to potentials of corresponding switch transistors from high to low, and
   an input terminal of the bootstrap power supply circuit in the series corresponding to the switch transistor with a lowest potential is connected to an output terminal of the driving power supply circuit.

5. The bridge cascade system according to claim 1, wherein the bootstrap power supply circuits in the phase unit are connected in a hybrid of serial connection and parallel connection.

6. The bridge cascade system according to claim 5, wherein N=2 and the phase unit comprises three bootstrap power supply circuits, which are referred to as, according to potentials from high to low: a first bootstrap power supply circuit, a second bootstrap power supply circuit, and a third bootstrap power supply circuit; and
   in the phase unit:
   a series arrangement of the second bootstrap power supply circuit and the third bootstrap power supply circuit is connected in parallel with the first bootstrap power supply circuit; or
   a series arrangement of the first bootstrap power supply circuit and the third bootstrap power supply circuit is connected in parallel with the second bootstrap power supply circuit; or
   a series arrangement of the first bootstrap power supply circuit and the second bootstrap power supply circuit is connected in parallel with the third bootstrap power supply circuit; or
   a parallel arrangement of the second bootstrap power supply circuit and the third bootstrap power supply circuit is connected in series with the first bootstrap power supply circuit; or
   a parallel arrangement of the first bootstrap power supply circuit and the third bootstrap power supply circuit is connected in series with the second bootstrap power supply circuit.

7. The bridge cascade system according to claim 1, wherein each of the bootstrap power supply circuits comprises a bootstrap diode and a bootstrap capacitor, wherein
   a cathode of the bootstrap diode is connected to a terminal of the bootstrap capacitor, and a connecting point is used as an output terminal of a corresponding bootstrap power supply circuit;
   an anode of the bootstrap diode is used as an input terminal of the corresponding bootstrap power supply circuit; and
   another terminal of the bootstrap capacitor is connected to a source of a corresponding switch transistor.

8. The bridge cascade system according to claim 1, wherein in the phase unit, at least one of the bootstrap power supply circuits is reused by arbitrary two of the driving circuits.

9. The bridge cascade system according to claim 8, wherein for two bridge topologies in the phase unit, the bootstrap power supply circuit is reused by a low-voltage side driving circuit in one of the two bridge topologies that has higher potential and a high-voltage side driving circuit in the other of the two bridge topologies that has lower potential.

10. The bridge cascade system according to claim 1, wherein in the phase unit, the driving circuit of the bridge topology that has lowest potential is directly connected to the driving power supply circuit.

11. The bridge cascade system according to claim 1, wherein N is greater than or equal to 3.

12. The bridge cascade system according to claim 1, wherein in the phase unit, the bridge topologies are cascaded on AC sides by a common source electrode, or cascaded on AC sides by a common drain electrode.

13. The bridge cascade system according to claim 1, wherein each of the bridge topologies is one of a complementary half-bridge topology, a complementary full-bridge topology, and a Buck-boost topology.

14. The bridge cascade system according to claim 1, further comprising a controller, configured to control, via the respective driving circuits, each of the bridge topologies in the phase unit to work in a corresponding working mode.

15. The bridge cascade system according to claim 14, wherein when the controller controls each of the bridge topologies in the phase unit to work in a corresponding working mode,
the controller controls each of the bridge topologies in the phase unit to work in either a chopping mode or a pseudo continuous conduction mode, wherein a low-voltage side switch transistor in a bridge topology working in the pseudo continuous conduction mode is intermittently turned on.

16. The bridge cascade system according to claim 15, wherein when the controller controls each of the bridge topologies in the phase unit to work in either the chopping mode or the pseudo continuous conduction mode,
the controller controls each of the bridge topologies in the phase unit to all work in the chopping mode or all work in the pseudo continuous conduction mode, so as to make the bootstrap power supply circuits in the phase unit be charged in one cycle.

17. The bridge cascade system according to claim 16, wherein when there are at least two bootstrap circuits connected in parallel in the phase unit, waveforms of the corresponding bridge topologies do not completely overlap with each other, so as to make the bootstrap power supply circuits in the phase unit be charged in one cycle.

18. The bridge cascade system according to claim 15, wherein when the controller controls each of the bridge topologies in the phase unit to work in either the chopping mode or the pseudo continuous conduction mode,
the controller controls, in the phase unit, at least one of the bridge topologies to work in the chopping mode, and at least one of the bridge topologies to work in the pseudo continuous conduction mode, so as to make the bootstrap power supply circuits in the phase unit be charged in one cycle.

19. The bridge cascade system according to claim 14, wherein in the phase unit, when the bridge topologies are cascaded on AC sides by a common drain electrode, the high-voltage switch transistors of two adjacent bridge topologies are not both turned on.

* * * * *